United States Patent [19]
Hutter et al.

[11] Patent Number: 5,576,233
[45] Date of Patent: Nov. 19, 1996

[54] METHOD FOR MAKING AN EEPROM WITH THERMAL OXIDE ISOLATED FLOATING GATE

[75] Inventors: Louis N. Hutter, Richardson; John P. Erdeljac, Plano, both of Tex.

[73] Assignee: Texas Instruments Incorporated, Dallas, Tex.

[21] Appl. No.: 493,377

[22] Filed: Jun. 21, 1995

[51] Int. Cl.$^6$ ............................................. H01L 21/8247
[52] U.S. Cl. ................................................ 437/43; 437/52
[58] Field of Search ........................ 437/43, 52; 257/316

[56] References Cited

U.S. PATENT DOCUMENTS

| | | |
|---|---|---|
| 4,398,338 | 8/1983 | Tickle et al. . |
| 4,980,309 | 12/1990 | Mitchell et al. ........................... 437/43 |
| 5,236,853 | 8/1993 | Hsue ........................................... 437/43 |
| 5,464,999 | 11/1995 | Bergemont ............................... 257/322 |
| 5,470,771 | 11/1995 | Fujii et al. ................................. 437/43 |

OTHER PUBLICATIONS

Wolf, "Silicon Processing for the VLSI Era vol. 2: Process Technology", Lattice Press, pp. 198–199 1990.

*Primary Examiner*—Mary Wilczewski
*Assistant Examiner*—Richard A. Booth
*Attorney, Agent, or Firm*—W. James Brady, III; Richard L. Donaldson

[57] ABSTRACT

A method for making an EEPROM (10) in a semiconductor substrate (40) and EEPROM made according to the method includes forming a gate dielectric (38), such as oxide, nitride, multilayer dielectric, or the like, on a surface of the substrate (40) and forming a polysilicon floating gate (19) on the gate dielectric (38). A control gate (25) is formed at least partially overlying the floating gate (19), and a thermal oxide layer (56) is formed on the floating gate (19) in regions that are not covered by the control gate. Thus, the thermal oxide layer (56) encases any regions of the floating gate (19) uncovered by the control gate (25) and serves as a high quality dielectric to isolate the floating gate (19) from charge loss and other deleterious effects. Then, source and drain regions (21,27) are formed in the substrate (40).

18 Claims, 8 Drawing Sheets

METHOD FOR MAKING AN EEPROM WITH THERMAL OXIDE ISOLATED FLOATING GATE

BACKGROUND OF THE INVENTION

1. Field of the Invention

This invention relates to improvements in semiconductor integrated circuits and semiconductor fabrication processes, and more particularly to improvements in EEPROM devices, and methods for making the same. The invention relates still more particularly to improvements in the layout and construction of the floating gate element of an EEPROM cell and to EEPROM devices using it. The invention relates still more particularly to improvements in EEPROM devices that have increased floating gate isolation and methods for making same, and to improvements in isolation techniques for isolating a floating gate structure of an EEPROM device.

2. Relevant Background

As advances are made in technologies related to electrically erasable read only memory (EEPROM) devices, EEPROM devices are being introduced into many semiconductor processes, such as CMOS, BiCMOS, linear BiCMOS process, such as LINBICMOS™, and other such advanced semiconductor processes. When EEPROM cells are produced for any semiconductor process, factors contributing to improving the ability to manufacture such EEPROM devices, and the potential impact of such factors on reliability of the final devices are of key concern.

Many EEPROM designs rely upon an associated tunnel diode to control the placement and removal of a charge onto and from a floating gate of the device. The tunnel diode typically is constructed with a doped tunnel diode region contained in the semiconductor substrate. Typically, a portion of the floating gate overlies the tunnel region, and is separated from the tunnel region by a thin oxide layer sometimes called the "tunnel oxide" through which charge may be passed to or from the floating gate. The quantity of charge on the floating gate controls the threshold voltage of an associated MOS transistor over the channel of which a portion of the floating gate is also located. The floating gate is generally separated from the channel of the MOS transistor by a thin gate dielectric or oxide. A control gate is also provided over and capacitively coupled to the floating gate. When the state of the EEPROM cell is read, a voltage is applied to the control gate, which is capacitively coupled to the floating gate. Depending upon the quantity of charge on the floating gate, the influence of the control gate voltage will either enable a current flow in the channel of the MOS transistor, or not, allowing the memory state of the cell to be determined.

Among the many considerations that affect design and construction of the tunnel diode region, the thickness and quality of the tunnel oxide are of basic importance. In previous EEPROM devices, the tunnel oxide generally has a thickness of about 100 Å, and the quality of tunnel oxide impacts the reliability and performance of the final EEPROM cell.

In the past, in the formation of a tunnel diode in association with the MOS transistor, a first portion of a gate oxidation was performed to provide an initial oxide thickness over the tunnel diode region as well as its peripheral areas. Thicker field oxide may also have been concurrently formed over more highly doped regions of the substrate at which field adjust implants may have been made. The oxide directly over the tunnel region was then stripped to expose

2 the substrate, and a dopant of appropriate type and conductivity to provide the desired tunnel region was introduced or implanted into the substrate.

The exposed substrate area was then again oxidized to produce the proper tunnel oxide thickness, about 100 Å. The surrounding oxide was also concurrently thickened, for example, to a final thickness of about 200 Å to 500 Å.

After the tunnel region and oxidation had been completed a polycrystalline silicon (polysilicon) floating gate was deposited patterned, and etched. It can be seen that the underlying oxide layer provided a relatively high quality encapsulation of at least the bottom and sidewall portions of the floating gate structure. During the subsequent construction of the control gate, a high quality dielectric, usually a nitride or other dielectric is formed between the floating and control gates to provide the capacitor dielectric. During subsequent processing, however, the portions of the capacitor dielectric that does not lie between the floating and control gates is generally stripped away, at least in part, to allow implantation of the source and drain elements of the MOS transistor, and to enable other required device structures.

In order to enable the charge to be maintained on the floating gate for extensive periods of time, on the order of ten years or longer, for example, the floating gate structure needs to be completely isolated. The usual isolation techniques employed in the past include the formation of one or more isolation layers on the top side of the floating gate.

In the past, one favored technique for isolating the floating gate involves forming tetraethylorthosilicate (TEOS) sidewalls on the floating gate, and subsequently encapsulating the topside of the floating gate with an additional layer of TEOS, since TEOS is usually used in the fabrication of other components associated with the EEPROM, and its deposition can be easily accomplished. However, the quality of TEOS (i.e., the electron barrier height of TEOS) is not as high as might be desired. In most CMOS processes, TEOS is used to form sidewall spacers on all CMOS gates. It should be noted that even if the topside were to be adequately isolated with a material other than TEOS, charge loss from the sidewalls can still pose a serious problem. Also, the portion of the polysilicon floating gate that overlies the transistor is generally not covered, in order to realize tighter design rules. As a consequence, electrons residing on the floating gate are enabled to tunnel off of the gate faster than might be desired, or even tolerable. The result, of course, is a reduction in the memory lifetime of the EEPROM cell.

SUMMARY OF THE INVENTION

In light of the above, therefore, it is an object of the invention to provide an improved EEPROM and method for making it.

It is another object of the invention to provide an EEPROM having a floating gate with improved isolation having improved charge retention properties, and method for making same.

It is yet another object of the invention to provide an EEPROM that can retain electron charge on its floating gate longer than similar devices in which the floating gate is at least partially isolated by TEOS, or materials having similar electron barrier heights as TEOS.

It is another object of the invention to provide an improved EEPROM structure and method for making the same that results in a device that has increased reliability with respect to data retention and write/erase endurance, compared with EEPROM cells in which the floating gate is isolated by traditional techniques.

These and other objects, features and advantages of the invention will be apparent to those skilled in the art from the following detailed description of the invention, when read in conjunction with the accompanying drawings and appended claims.

Thus, in accordance with a broad aspect of the invention, an EEPROM is presented in which topside and sidewall portions of the floating gate that do not underlie the control gate are covered with a high quality thermal oxide. Thus, the dielectric provided by nitride capacitor dielectrics between the floating and control gates, the thermal oxide between the floating gate and substrate, and the topside and sidewall thermal oxide provide a quality isolation with higher electron barriers than the barrier heights of previously used isolation layers that include TEOS.

In accordance with a broad aspect of the invention, a method is presented for making an EEPROM in a semiconductor substrate. The method includes forming a gate dielectric on the substrate. A polysilicon floating gate is formed on the gate dielectric, with a portion extending over a channel region of the EEPROM. An insulation layer is formed on the polysilicon floating gate, a portion of which is removed to expose regions of the polysilicon floating gate that the control gate will not cover, and a thermal oxide layer is formed on the polysilicon floating gate in those exposed regions. The control gate is then formed, partially overlying the polysilicon floating gate. Source and drain regions are then formed in the substrate on respective sides of the channel region.

According to another broad aspect of the invention, a method for making an EEPROM is presented. The method includes forming a lightly doped epitaxial layer on a heavily doped substrate, and implanting channel stop regions in the lightly doped semiconductor layer, at least partially surrounding an area in which the EEPROM is to be contained. A dielectric layer is formed on the surface of the lightly doped layer, and a first layer of polysilicon is formed on the dielectric layer. The first layer of polysilicon is patterned to provide a floating gate for the EEPROM. A first oxide layer is formed over the floating gate to provide a control gate oxide layer, and a layer of nitride is formed over the first oxide layer. The nitride and control gate oxide are stripped to the surface of the lightly doped semiconductor layer in regions away from the floating gate and in regions where feature implants are to be performed. A second layer of oxide is formed on the first layer of polysilicon to encapsulate the first layer of polysilicon that will remain uncovered by an overlying control gate. A second layer of polysilicon is formed to serve as the control gate. First portions of source and drain regions are formed in the lightly doped semiconductor layer using a portion of the floating gate that overlies a channel region as an implant mask, and a first layer of tetraethylorthosilicate (TEOS) are formed and anisotropically etched to provide sidewall spacers on portions of the floating gate that overlie the channel region. Additional portions of the source and drain regions are then implanted in the lightly doped semiconductor layer using the TEOS sidewall spacers as an implant mask. A second TEOS layer is then formed overall.

According to still another broad aspect of the invention, an EEPROM having a floating gate that is encapsulated by high quality insulation is presented. The EEPROM is constructed in a semiconductor substrate, and has a source, drain, and channel. An insulating layer overlies the substrate and the channel. A floating gate overlies the insulating layer to carry a controllable quantity of charge, the floating gate at least partially overlying the channel to control a current threshold in the channel according to a quantity of charge on the floating gate. A control gate overlies a portion of the floating gate, separated from the floating gate by a dielectric layer. A layer of thermal oxide envelopes portions of the floating gate that are not overlain by the control gate.

BRIEF DESCRIPTION OF THE DRAWING

The invention is illustrated in the accompanying drawing, in which.

In the various drawings, which are not drawn to scale, like reference numerals are used to denote like or similar parts.

DETAILED DESCRIPTION OF THE PREFERRED EMBODIMENTS

It should be noted that the process steps and structures herein described do not necessarily form a complete process flow for manufacturing integrated circuits. It is anticipated that the invention may be practiced in conjunction with integrated circuit fabrication techniques currently used in the art, and only so much of the commonly practiced process steps are included as are necessary for an understanding of the invention.

Figure 1:
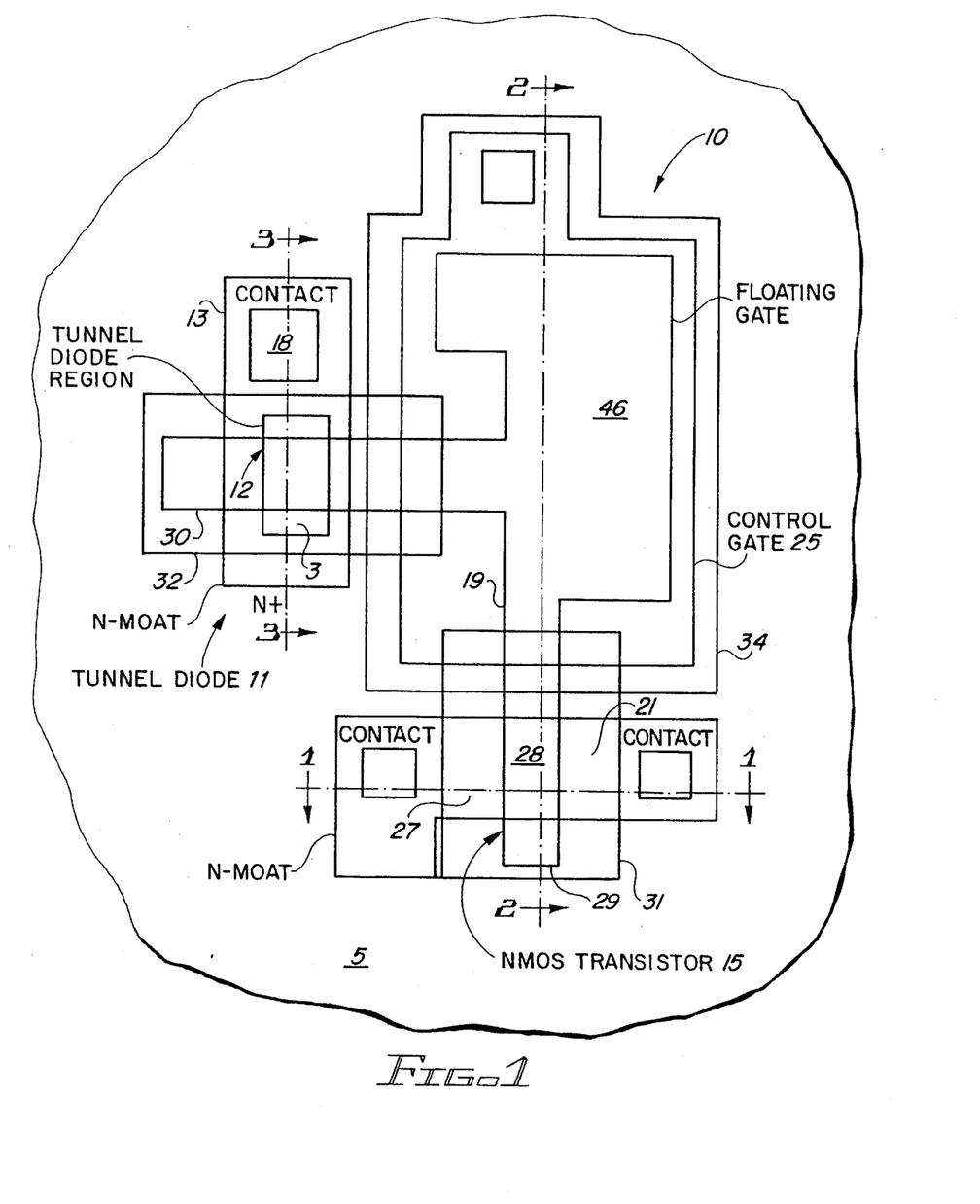
FIG. 1 is a top view of the layout of a portion of an EEPROM device layout, showing a floating gate that has been isolated according to a preferred embodiment of the invention.

One embodiment of an EEPROM device is illustrated in FIG. 1, which shows a top view of a portion of the layout of an EEPROM device 10 that has been formed on a semiconductor substrate 5, in accordance with a preferred embodiment of the invention. The layout in FIG. 1 shows outlines of the various EEPROM levels to illustrate the respective lateral interpositions of the levels, with vertical details best seen in the cross sectional views of FIGS. 2a–2g. The configuration shown in FIG. 1 has been selected to illustrate one device layout that may be employed in practicing the present invention, and it is to be noted that other layouts may be equally advantageously employed, as will be apparent to those skilled in the art.

The EEPROM device 10 is described in the context of an NMOS transistor formed in the region 15, although devices of other conductivity types can be also fabricated using the techniques described herein. The EEPROM device 10 is constructed in a silicon substrate 5 of P type conductivity, which may include a tank or moat region 13 of n type conductivity formed therein. A tunnel diode 11 is formed in the moat region 13 by which charge may be delivered to and from a floating gate 19 within the tunnel region 12. A contact 18 (also seen in FIG. 2g) is constructed in the N moat 13 for carrying current to and from the tunnel diode to control the charge on the floating gate 19. Details of the fabrication of a tunnel diode that may be used in the construction of the EEPROM 10 may be found in copending patent application titled TUNNEL DIODE LAYOUT FOR AN EEPROM CELL FOR PROTECTING THE TUNNEL DIODE REGION by the applicants hereof, Ser. No. 08/347,998, filed Dec. 5, 1994, and assigned to the assignee hereof, said patent application being incorporated herein by reference.

It should be noted that in the embodiment illustrated, an n moat 13 is described, although any n type region that is defined independently from the active regions can be used. The exact location and size of the n moat 13 with respect to other doping levels in the active area is a function of the junction depth of the active region and misalignment tolerances. The particular position of the n moat 13 in FIG. 1, for example, has been selected to demonstrate the invention, and may, but does not necessarily, represent an optimal location.

The floating gate 19 of the EEPROM device 10 holds a charge for controlling the threshold of the associated NMOS transistor 15, as known in the art. The precise shape of the floating gate 19 is not significant, the primary consideration being that the floating gate 19 should present a sufficient size to provide a satisfactory capacitive coupling to the overlying control gate 25 so that the charge on the floating gate 19 can control the voltage threshold of the NMOS transistor 15. In the embodiment illustrated, the floating gate 19 has a central body portion beneath the control gate 25, with elongated extensions 30 and 29 overlying the tunnel region 12 and the channel 28 of the MOS transistor 15. The main body of the control gate 25 is included on an "NSD" masking layer 34. The NSD masking layer 34 may be followed, for example, by an implant which dopes the overlying control gate 25 to lower its resistivity during the implant of the N+ source drain regions of the associated transistor 15.

In a manner similar to the structure described in said copending patent application, Ser. No. 08/347,998, the tunnel diode 11 has an N moat 13, which has an N+ impurity level below a extension portion 30 of the polysilicon floating gate 19. The N+ doping of the region 13 is accomplished by first implanting the N+ tunnel region 12 before the polysilicon floating gate 19 is constructed. Then, after the polysilicon floating gate 19 has been constructed the entire region 13 is implanted with a high concentration donor impurity, preferably concurrently with an N+ source/drain implant of an associated transistor. The extension 30 of the polysilicon floating gate 19 will, however block a part of this second implant. A thin oxide layer of about 100 Å thickness lies between the N+ tunnel diffusion 12 and the polysilicon floating gate 19. The actual location of the tunnel diode region 12 is not of primary importance; in some embodiments, for example, the tunnel diode region may be located directly beneath the central body of the polysilicon floating gate 19, in which case, the portion of the thermal oxide isolation thereover, as below described, may be unnecessary.

In the embodiment shown, the NMOS transistor 15 associated with the EEPROM device 10 is formed with N+ type source 21 and drain 27 regions on each side of a channel region 28. An extension portion 29 of the floating gate 19 extends over the channel 28, separated from the channel by a gate oxide, or other gate dielectric, best seen in FIG. 2g. The control gate 25, separated by a second layer of oxide 50 and a layer of nitride 52 from the floating gate, also best seen in FIG. 2g, is capacitively coupled to the floating gate 19 to control the current flow in the channel 28, in a manner known in the art.

Although the main body portion of the floating gate 19 underlies the control gate 25, it will be appreciated that portions of the extensions 29 and 30 of the floating gate 19 may be exposed at this point in the completion of the fabrication process of the EEPROM 10, especially those portions from which the overlying oxide and nitride layers have been selectively removed to enable feature implants, such as the source and drain elements of the MOS transistor 15 and the connection regions of the tunnel diode 11. Thus, to protect the exposed portions of the extensions 29 and 30 of the floating gate 19 that may exist, layers of thermal oxide 31 and 32 are provided over the extensions 29 and 30. The thermal oxide portions 31 and 32 are provided to extend from a point over the control gate 25 to a region beyond the end of the respective extensions 29 and 30 of the floating gate 19. The thermal oxide regions 31 and 32 may be about 2000 Å thick, or more, to provide a high quality isolation for the underlying floating gate 19, especially in combination with the oxide and nitride control gate dielectrics over the central body of the floating gate 19, and the overall thermal oxide layer beneath the floating gate 19. Although only two thermal oxide regions 31 and 32 are shown, other regions may be included, if necessary; likewise, if fewer regions are needed, for example, if the tunnel region is located beneath the floating gate 19, only one region of thermal oxide may be necessary.

Figure 2A:
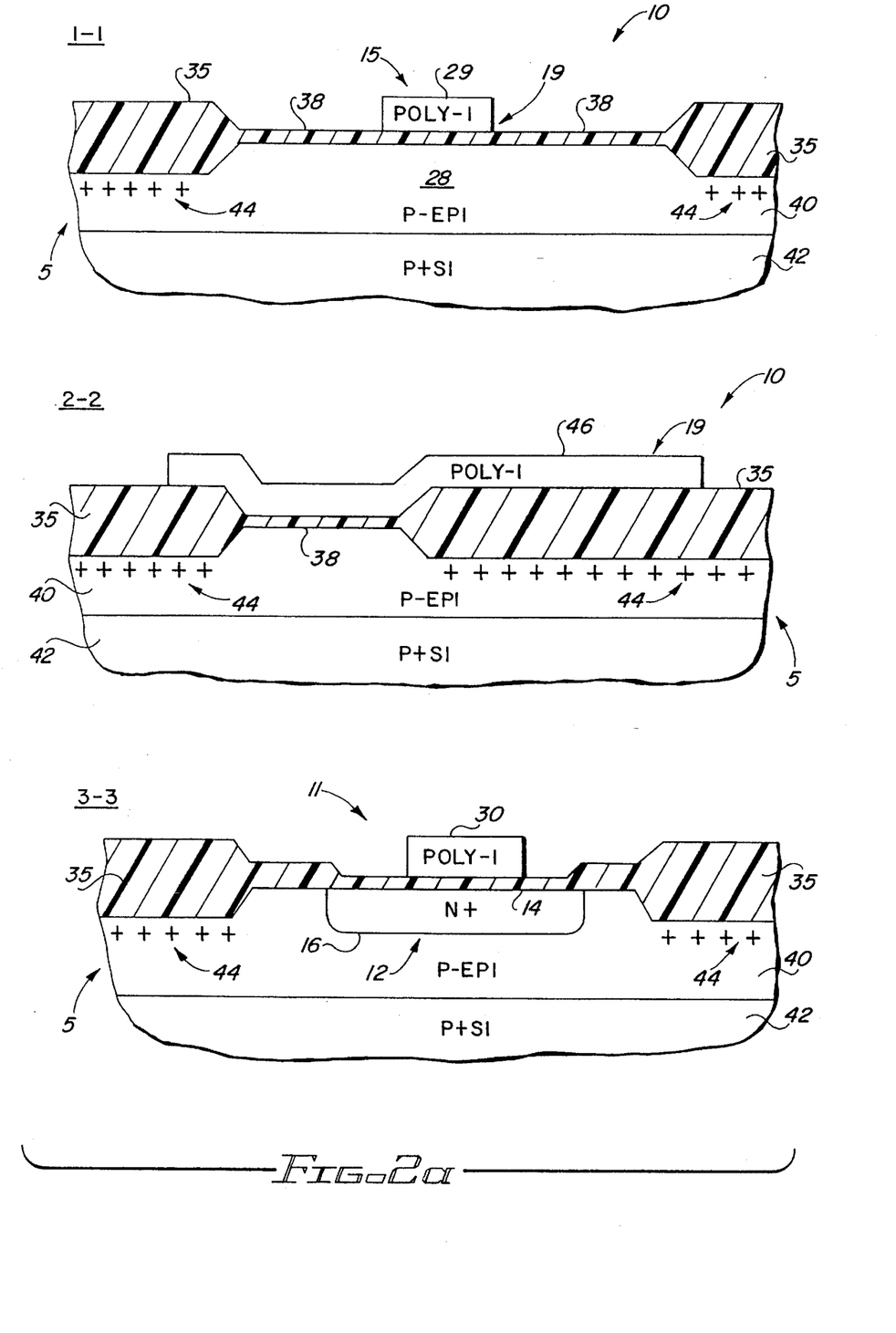
FIGS. 2a–2g are sets of cross sectional views taken at 1—1, 2—2, and 3—3 in FIG. 1, showing the steps used in the formation of the floating gate isolation of the EEPROM device depicted in FIG. 1, according to a preferred embodiment of the invention.
Figure 2B:
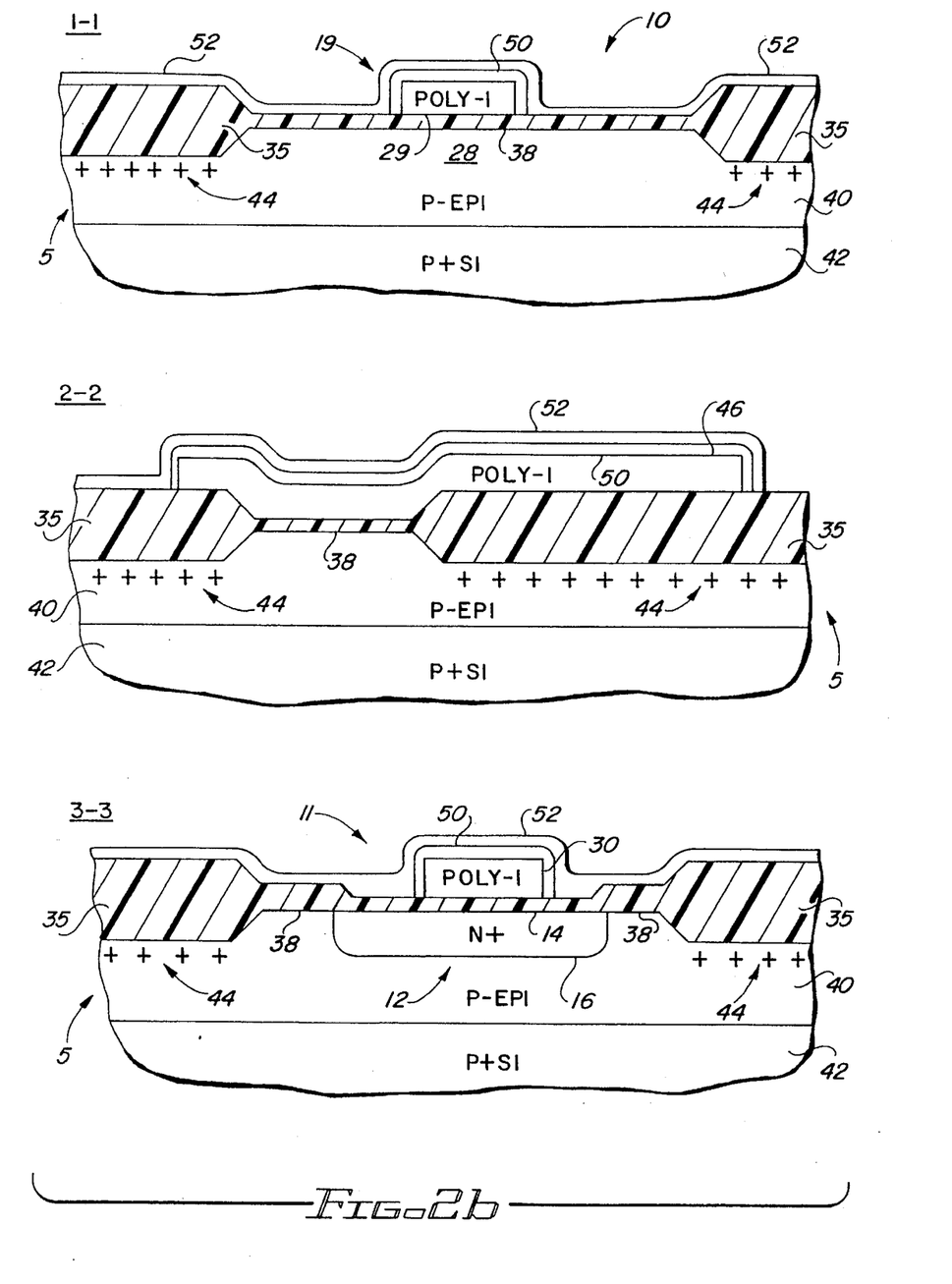
Figure 2C:
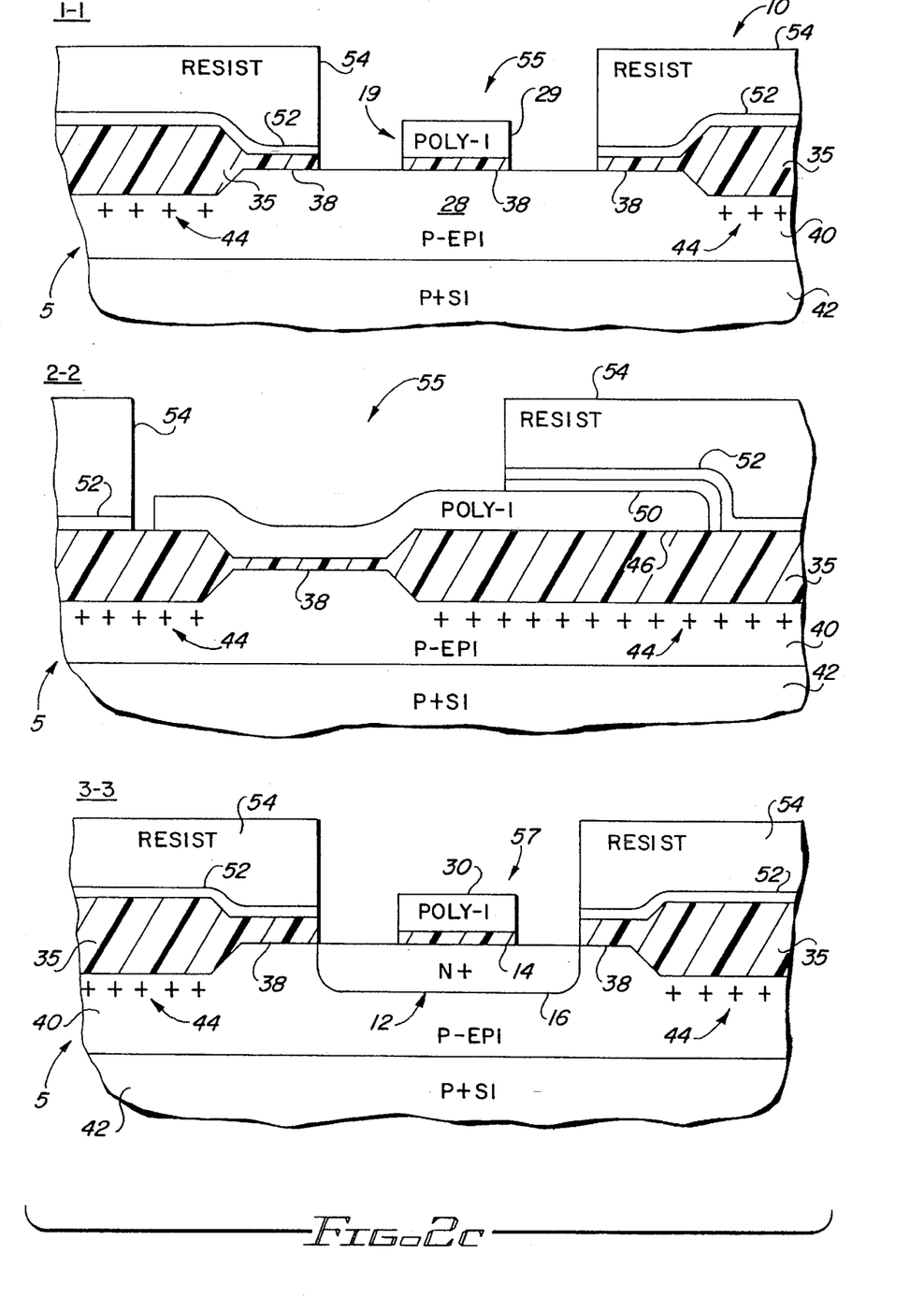
Figure 2D:
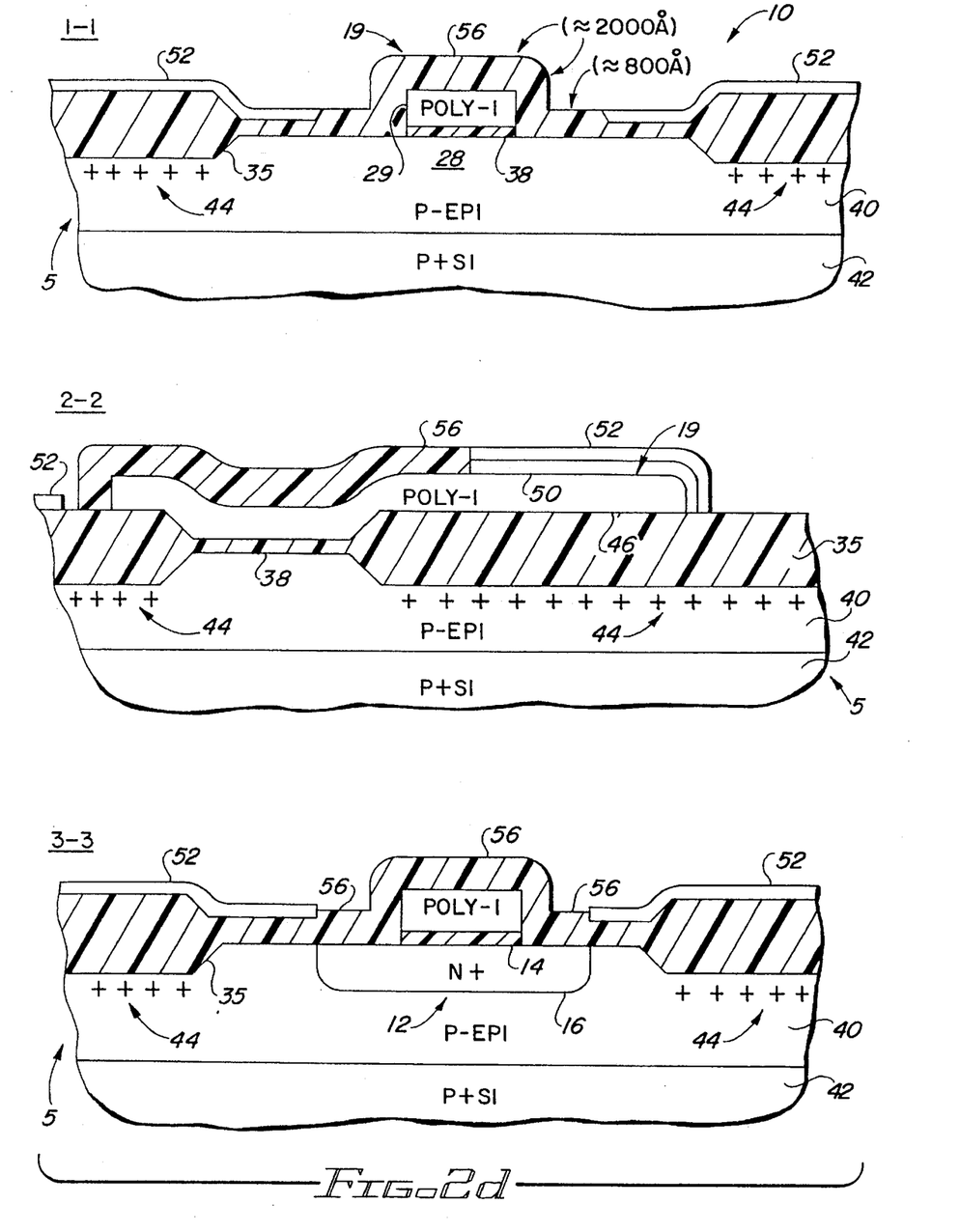
Figure 2E:
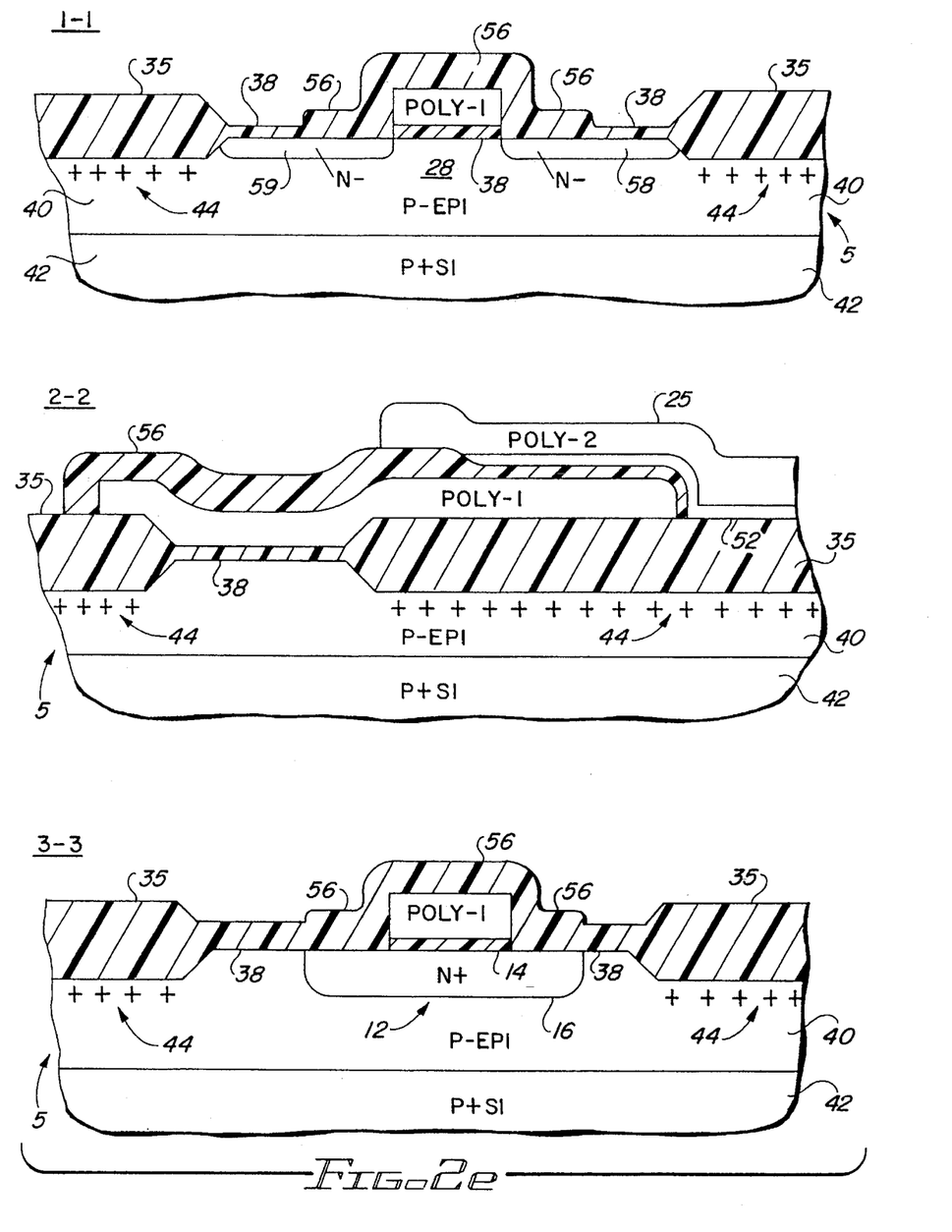
Figure 2F:
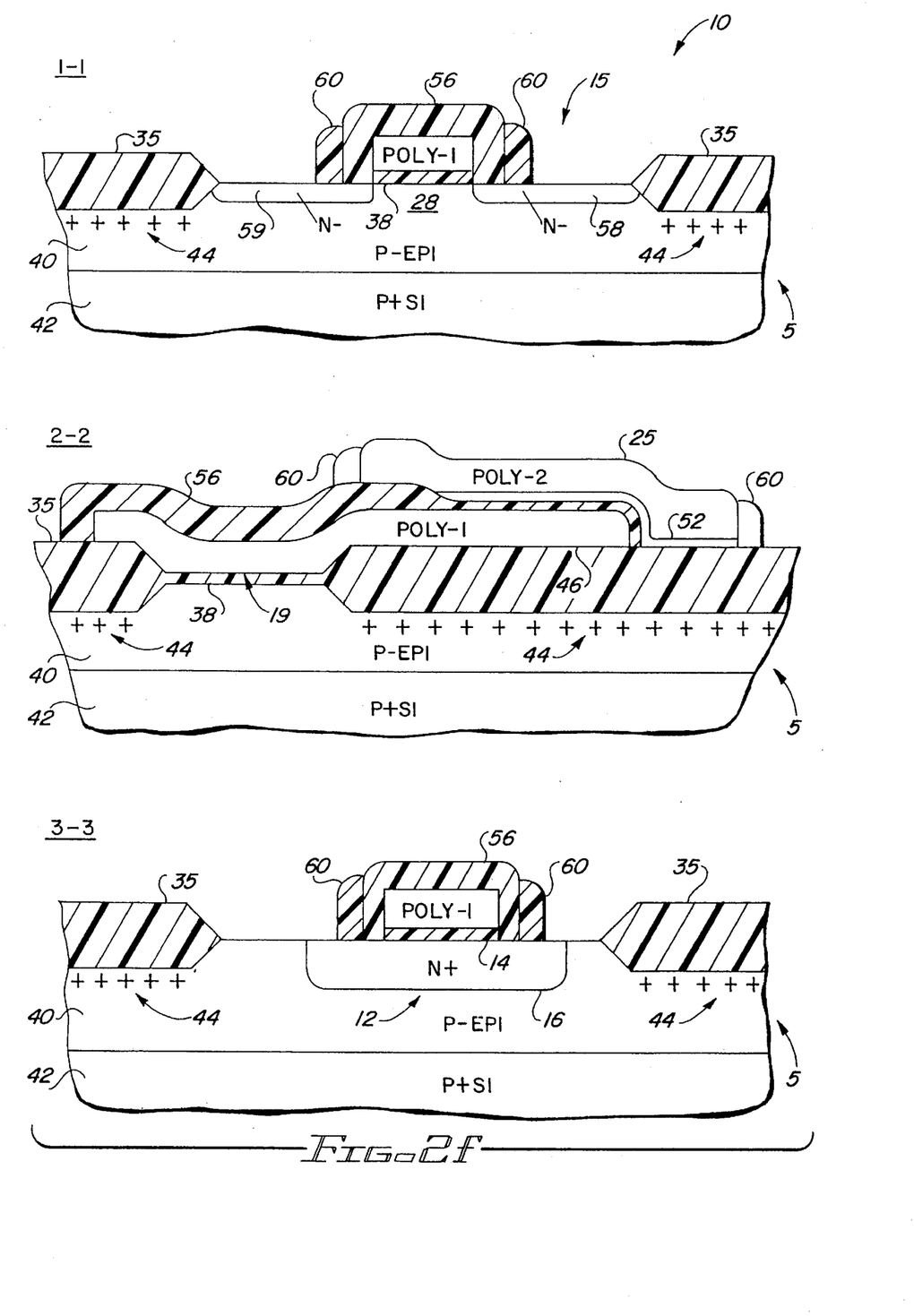
Figure 2G:
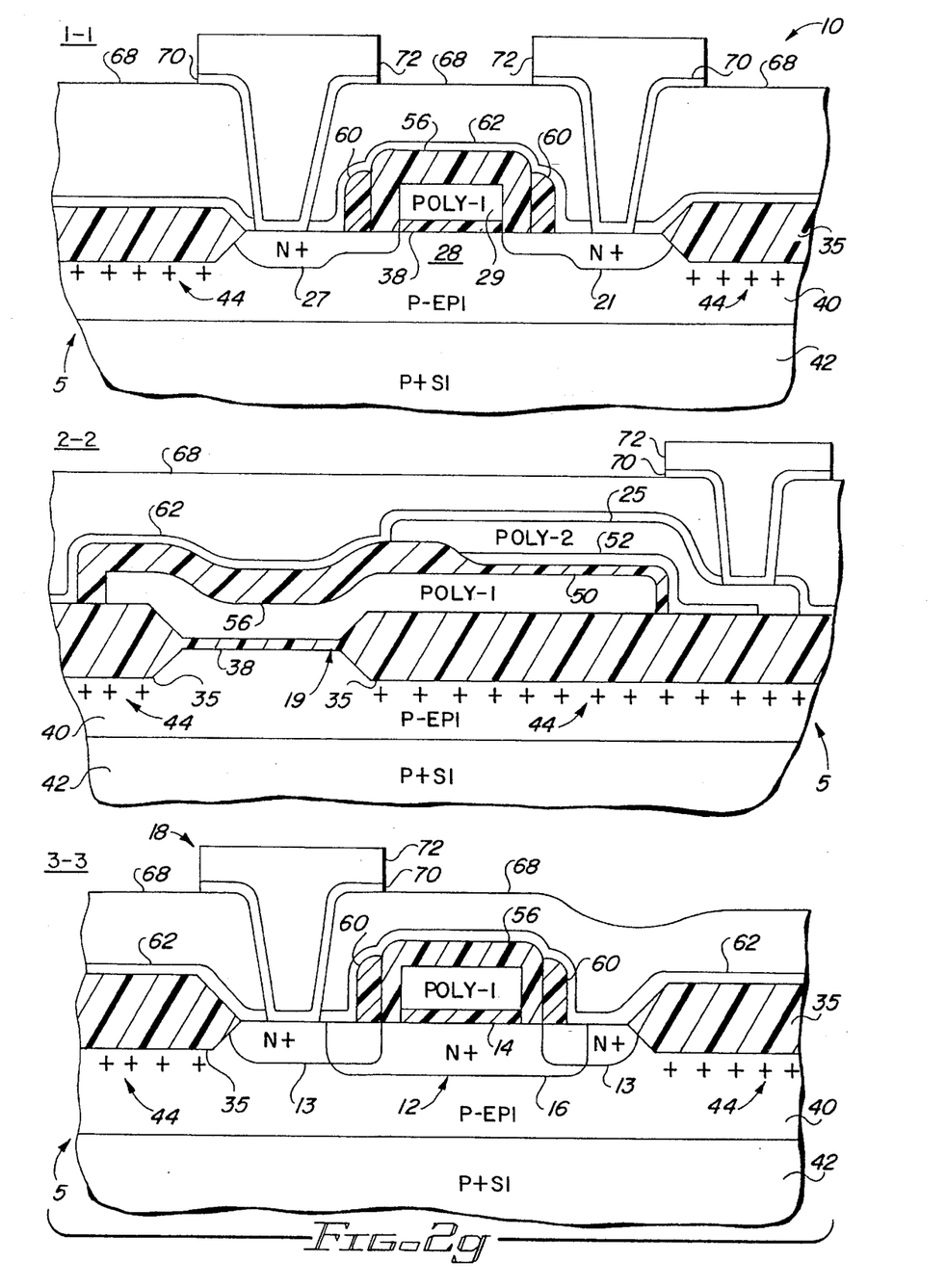

The process for making the EEPROM device 10 of FIG. 1 is shown in the sequence of cross sectional views of FIGS. 2a–2g, taken at 1—1, 2—2, and 3—3 in FIG. 1. With reference first to FIG. 2a, the EEPROM device 10 is formed on a substrate 5, which has a layer of epitaxially grown silicon 40, which is lightly doped with an acceptor (P−) impurity, on a heavily doped silicon substrate 42, which is heavily doped with an acceptor (P+) impurity. Moderately doped channel stop or field regions 44 then are formed, preferably by using standard LOCOS techniques and implanting boron into the eventual field oxide regions 35 that surround the active region that will contain the NMOS transistor 15, in a manner known in the art. The implantation dose is adjusted to provide for isolation of the EEPROM 10, as well as other various structures that may be formed in the substrate 5, and for field threshold adjustment, and to suppress parasitic thick field action.

After LOCOS processing, the gate dielectric 38 is grown. The gate dielectric 38 is preferably thermally grown oxide, typically with a thickness in the 200 Å–500 Å range. The gate dielectric can also be a nitride, multilayer dielectric, or the like, known in the art. Next, the tunnel region 12 is formed by patterning resist, etching the exposed gate oxide, implanting an N type dopant 16, such as phosphorus or arsenic, with a dose of about $5 \times 10^{14}$ atoms/cm$^2$, and growing a thin (about 100 Å) thermal oxide 14.

Then, a first layer of polysilicon (herein "poly-1") is formed over the gate oxide. The poly-1 layer is then doped N+, either by implant or furnace doping techniques, masked and etched to form the floating gate 19, one general configuration of which being best seen in FIG. 1. The portion 29 of the floating gate that overlies the channel region of the NMOS transistor is formed over the thinner gate oxide 38, and the body region 46 that is formed over the field oxide overlies the thicker field oxide region 35.

As shown in FIG. 2b, after the poly-1 layer has been formed, a layer of oxide 50 is formed over the poly-1 floating gate 19, including the regions 29 and 46. Since the poly-1 floating gate 19 is heavily doped, the oxide layer 50 grows to a greater thickness in areas where it contacts the poly-1 floating gate 19, compared to its thickness elsewhere. Thus, the oxide in the regions of the device are very thin compared to the oxide on the top and sidewalls of the poly-1 floating gate 19, the very thin oxide regions not being represented in the drawings. The oxide layer 50 may be, for example, about 200 Å thick over the N+ poly-1 floating gate 19, about 80 Å over bare silicon, and essentially 0 Å elsewhere. Then, a layer of interlevel nitride 52 is formed overall. The oxide layer 50 and nitride layer 52 provide a capacitor dielectric between the floating gate 19 and the overlying control gate 25. It is noted that at this point in the fabrication process, the floating gate 19 is fully encapsulated with high quality dielectric on all sides.

With reference next to FIG. 2c, a photoresist mask 54 is next constructed, with window openings 55 and 57 to expose the region at which the NMOS transistor is to be fabricated and to expose the region at which the tunnel diode is to be formed. The portions of the nitride layer 52, the oxide layer 50, the oxide layer 38, and the oxide layer 14 that are exposed within the window are then stripped to the surface level of the epitaxial layer 40 and poly-1 layer 46. This will enable an encapsulating oxide to be grown over the regions of the poly-1 floating gate that will not be covered by the control gate 25, which will be subsequently constructed. At the same time, when portions of the nitride layer 52, the oxide layer 50, and the oxide layer 38 are removed to expose a region of the tunnel diode 11 (see FIG. 1), another portion of the floating gate 19 may be exposed, which also will be protected by the subsequent encapsulating oxide.

The photoresist mask 54 is then removed, and a second layer of oxide 56 is grown, as shown in FIG. 2d. The second layer of oxide 56 may be thermal oxide, or oxide that is formed by heating the structure to a sufficient temperature to cause silicon oxide to grow on any exposed silicon area or region. As the oxide 56 is formed, it completely encapsulates the areas of the floating gate 19 that are not already covered by the nitride layer 52. The oxide 56 grows to a thickness of about 2000 Å on the top and sidewalls of the N+ poly-1 floating gate 19, but only grows to a thickness of about 800 Å over surrounding exposed silicon areas. Thus, the floating gate 19 is completely isolated with high quality dielectric, even in areas that will not underlie the control gate and other layers formed in subsequent processing steps.

A second polysilicon ("poly-2") layer 25 is formed overall and doped N type, for example with a phosphorus or arsenic implant, or with a phosphorus furnace deposition. The poly-2 layer is then patterned and etched to serve as the control gate 25, as shown in FIGS. 1 and 2e. Any nitride 52 remaining in areas that will not underlie the control gate 25 is etched away as the poly-2 patterning etch is performed.

As shown next, first portions of the source 58 and drain 59 regions are formed, for example, by exposing the structure to a donor impurity implant, such as phosphorus, to define the channel 28 of the NMOS transistor and to provide the lightly doped source and drain extensions adjacent to it.

Then, as shown in FIG. 2f, a first layer of tetraethylorthosilicate (TEOS) is formed overall with a thickness of about 3000 Å and anisotropically etched to form TEOS sidewall spacers 60, on the sidewalls of the floating gate structure over the channel 28 and on the sidewalls of the floating and control gate structures elsewhere. The selective etch will thin, but not remove, the thicker oxide 56 which overlies the N+ poly-1 floating gate 19. However, the thinner oxide mentioned above on the surrounding silicon will be removed completely, allowing subsequent source and drain implants to reach the silicon. A second source and drain implant (and tunnel diode contact implant) may then be performed to form highly doped source and drain regions 21 and 27, shown in FIG. 2g, using the TEOS sidewall spacers 60 as an implant mask.

Then, a second TEOS layer 62 is formed overall to a thickness of about 300 Å. It is noted that in the past, the first TEOS layer 60 and the second TEOS layer 62 may have provided the mechanism by which the floating gate 19 was isolated, which, as mentioned, was oftentimes unsatisfactory. However, due to the previous formation of the thermal oxide layer 56 around the N+ poly-1 in exposed regions of the floating gate 19, the potentially deleterious effects of the TEOS have been eliminated.

Finally, the device is fully encapsulated with a layer of BPSG 68 or other insulating material. Holes are then formed and metal contacts are made to the source 21 and drain 27 regions of the NMOS device, to the control gate 25, and to the tunnel diode. The metal contacts may be formed, for example, by a depositing a TiW layer 70 followed by an aluminum-copper alloy 72, as shown. The device fabrication process may then be completed with conventional processing steps.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

We claim:

1. A method for making an EEPROM in a semiconductor substrate, comprising:

forming a gate dielectric on a surface of said substrate;

forming a polysilicon floating gate on said gate dielectric extending over a channel region of said EEPROM, said polysilicon floating gate having an upper surface and sidewall surfaces;

forming an insulation layer on said upper surface and said sidewall surfaces of said polysilicon floating gate;

removing a portion of said insulation layer from said polysilicon floating gate to expose regions of said upper surface and said sidewall surfaces of said polysilicon floating gate that a control gate will not cover;

forming a thermal oxide layer on said polysilicon floating gate in said exposed regions;

forming said control gate partially overlying said polysilicon floating gate; and forming source and drain regions in said substrate on respective sides of said channel region.

2. The method of claim 1 wherein said step of forming said thermal oxide layer comprises heating said substrate to a sufficient temperature to cause silicon oxide to grow on any exposed silicon.

3. The method of claim 1 wherein said step of forming a gate dielectric comprises forming an oxide layer.

4. The method of claim 3 wherein said step of forming a layer of oxide comprises growing a layer of thermal oxide to a thickness of between about 100 Å–300 Å.

5. The method of claim 1 wherein said step of forming a gate dielectric comprises forming a multilayered gate dielectric on said surface.

6. The method of claim 1 wherein said step of forming a polysilicon floating gate comprises forming and patterning a first polysilicon layer, and wherein said step of forming a control gate comprises forming and patterning a second polysilicon layer.

7. A method for making an EEPROM in a semiconductor substrate, comprising:

forming a gate dielectric on a surface of said substrate;

forming a polysilicon floating gate on said gate dielectric extending over a channel region of said EEPROM;

forming an insulation layer on said polysilicon floating gate;

removing a portion of said insulation layer from said polysilicon floating gate to expose regions of said polysilicon floating gate that a control gate will not cover;

forming a thermal oxide layer on said polysilicon floating gate in said exposed regions;

forming said control gate partially overlying said polysilicon floating gate; and forming source and drain regions in said substrate on respective sides of said channel region, wherein said step of forming said source and drain regions comprises implanting a first impurity into source and drain regions of said substrate; forming sidewall spacers on at least a portion of said polysilicon floating gate which overlies said channel; and implanting a second impurity into said source and drain regions.

8. A method for making an EEPROM, comprising:

forming a lightly doped semiconductor layer on a heavily doped substrate of a same conductivity type;

forming channel stop regions in said lightly doped semiconductor layer at least partially surrounding an area in which said EEPROM is to be contained;

forming a dielectric layer on a surface of said lightly doped semiconductor layer;

forming a first layer of polysilicon on said dielectric layer;

patterning said first layer of polysilicon to provide a floating gate for said EEPROM;

forming a first oxide layer over said floating gate to provide a control gate oxide layer;

forming a layer of nitride over said first oxide layer;

stripping said nitride and control gate oxide to a surface of said lightly doped semiconductor layer in regions away from said floating gate and in regions where future implants are to be performed;

forming a second layer of oxide on said first layer of polysilicon to encapsulate said first layer of polysilicon that will remain uncovered by an overlying control gate;

forming a second layer of polysilicon to serve as the control gate;

implanting to form first portions of source and drain regions in said lightly doped semiconductor layer using a portion of said floating gate that overlies a channel region as an implant mask;

selectively forming a first layer of tetraethylorthosilicate (TEOS) to provide sidewall spacers on portions of said floating gate that overlie the channel region;

implanting to form additional portions of said source and drain regions in said lightly doped semiconductor layer using said TEOS sidewall spacers as an implant mask;

forming a second TEOS layer over the control gate and the second layer of oxide.

9. The method of claim 8 wherein said step of forming a second layer of oxide comprises forming a layer of a thermal oxide.

10. The method of claim 9 wherein said step of forming a layer of a thermal oxide comprises heating said substrate to a sufficient temperature to cause oxide to grow on any exposed silicon to completely encapsulate regions of said floating gate on which said thermal oxide is grown.

11. The method of claim 8 wherein said step of forming a lightly doped semiconductor layer comprises epitaxially growing a lightly doped semiconductor layer.

12. The method of claim 11 wherein said step of epitaxially growing a lightly doped semiconductor layer further comprises introducing a P type impurity into said epitaxially grown layer while performing said epitaxially growing step.

13. The method of claim 8 wherein said step of forming heavily doped channel stop regions comprises masking regions in which said channel stop regions are to be formed, and implanting an acceptor type impurity into said regions.

14. The method of claim 13 wherein said step of implanting said regions comprises implanting said regions with boron.

15. The method of claim 8 wherein said step of forming a dielectric layer on a surface of said lightly doped semiconductor layer comprises forming an oxide layer on said surface.

16. The method of claim 15 wherein said step of forming an oxide layer comprises growing an oxide layer to a thickness of between of about 100 Å–300 Å to form a gate oxide for said EEPROM.

17. The method of claim 8 wherein said step of forming a dielectric layer on a surface of said lightly doped semiconductor layer comprises forming a multilayered dielectric on said surface.

18. The method of claim 8 wherein said step of forming said first oxide layer comprises forming said first oxide layer to a thickness of about 200 Å.

* * * * *